United States Patent
Nallamothu

(10) Patent No.: US 10,075,139 B2
(45) Date of Patent: Sep. 11, 2018

(54) LINEAR HIGH VOLTAGE DRIVER WITH PROGRAMMABLE DIFFERENTIAL AND COMMON MODE GAIN

(71) Applicant: STMicroelectronics, Inc., Coppell, TX (US)

(72) Inventor: Pavan Nallamothu, Little Elm, TX (US)

(73) Assignee: STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 15/346,064

(22) Filed: Nov. 8, 2016

(65) Prior Publication Data

US 2018/0131341 A1    May 10, 2018

(51) Int. Cl.
| | |
|---|---|
| *H03K 3/00* | (2006.01) |
| *H03G 3/00* | (2006.01) |
| *H03K 5/02* | (2006.01) |
| *H03K 17/687* | (2006.01) |

(52) U.S. Cl.
CPC .............. *H03G 3/001* (2013.01); *H03K 5/02* (2013.01); *H03K 17/6872* (2013.01)

(58) Field of Classification Search
None
See application file for complete search history.

(56) References Cited

U.S. PATENT DOCUMENTS

| | | | |
|---|---|---|---|
| 2003/0058047 A1* | 3/2003 | Sakurai | H03F 3/45197 330/253 |
| 2013/0250631 A1* | 9/2013 | Liao | H02M 1/126 363/44 |
| 2016/0218617 A1* | 7/2016 | Liao | H02M 1/126 |

\* cited by examiner

*Primary Examiner* — Long Nguyen
(74) *Attorney, Agent, or Firm* — Crowe & Dunlevy

(57) ABSTRACT

A low voltage to high voltage (LV2HV) conversion circuit has an input configured to receive an input signal (at a relatively low voltage) and an output configured to generate an output signal (at a relatively high voltage). The LV2HV conversion circuit includes a voltage to current conversion circuit referenced to the relatively low voltage and configured to convert a voltage of the input signal to a first current, wherein a magnitude of the first current is dependent on said voltage of the input signal and a gain setting value. A current mirroring circuit mirrors the first current and outputs a second current. A current to voltage conversion circuit converts the second current to a voltage of the output signal. The current mirroring circuit and current to voltage conversion circuit are referenced to the relatively high voltage.

37 Claims, 3 Drawing Sheets

LINEAR HIGH VOLTAGE DRIVER WITH PROGRAMMABLE DIFFERENTIAL AND COMMON MODE GAIN

TECHNICAL FIELD

The present invention relates to driver circuits and, in particular, to a driver circuit that receives a low voltage differential input and generates a high voltage differential output with programmable differential and common mode gain.

BACKGROUND

There are a number of system applications where a device must be driven with a relatively high voltage signal by a control circuit that outputs a relatively low voltage control signal. For example, a gyrometer (i.e., a gyroscope and accelerometer) device may be driven with a drive signal having a relatively high voltage of between 18-25V. However, the control circuit used to control device operation may only output a control signal with a relatively low voltage of 1-3V. A driver circuit is accordingly needed to gain up the control signal to provide the drive signal. It is important that the driver circuit exhibit a linear operation.

SUMMARY OF THE INVENTION

It is to be understood that both the foregoing general description and the following detailed description are exemplary and explanatory and are intended to provide further explanation of the invention as claimed.

In an embodiment, a voltage driver circuit comprises a low voltage to high voltage (LV2HV) conversion circuit having an input configured to receive an input signal and having an output configured to generate an output signal. The LV2HV conversion circuit comprises: a voltage to current conversion circuit configured to convert a voltage of the input signal to a first current, wherein a magnitude of the first current is dependent on said voltage of the input signal and a gain setting value; a current mirroring circuit configured to mirror the first current and output a second current; and a current to voltage conversion circuit configured to convert the second current to a voltage of said output signal.

BRIEF DESCRIPTION OF THE DRAWINGS

The accompanying drawings are included to provide a further understanding of the invention and are incorporated in and constitute a part of this specification, illustrate embodiments of the invention and together with the description serve to explain the principles of the invention.

In the drawings.

DETAILED DESCRIPTION

Figure 1:
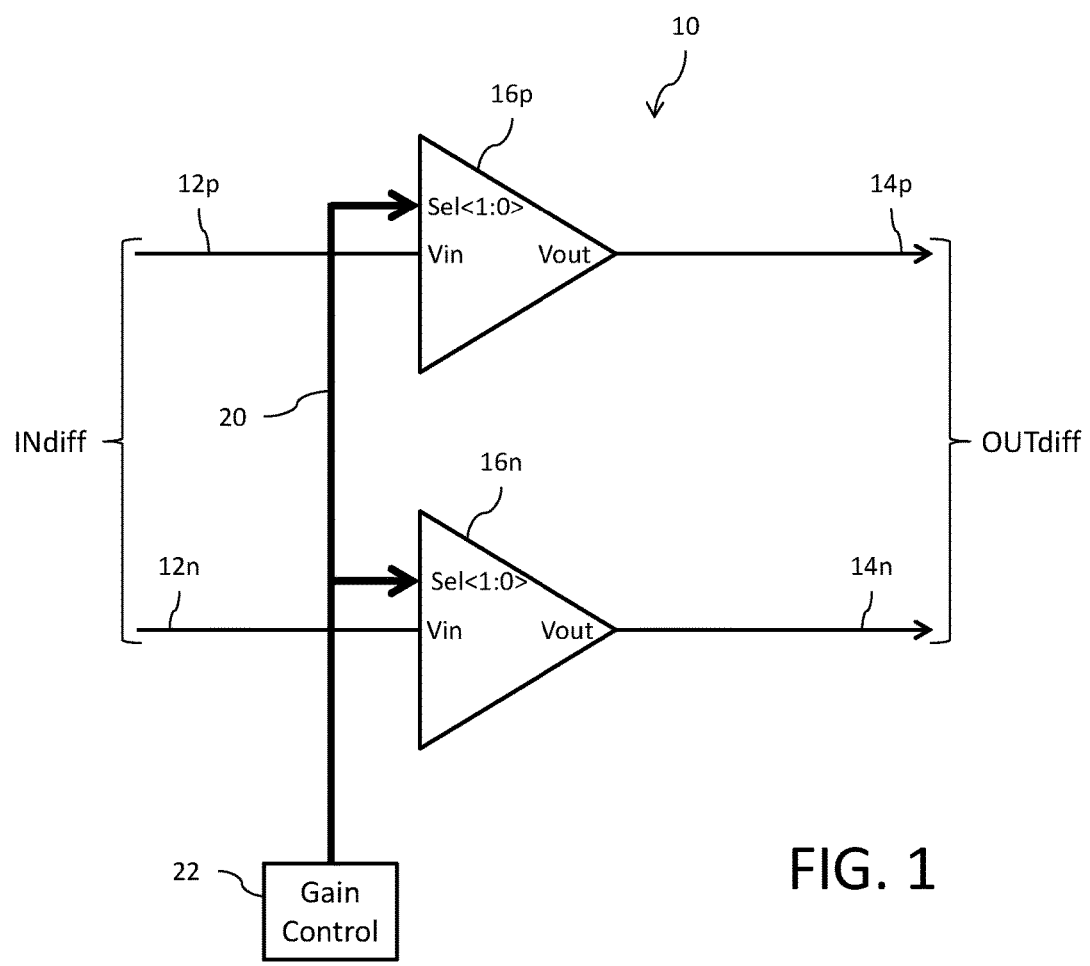
FIG. 1 is a block diagram of a driver circuit.

Reference is now made to FIG. 1 showing a block diagram of a driver circuit 10.

The driver circuit 10 receives a differential input signal (INdiff) including a first signal component 12p (for example, a non-inverting (positive) signal component (INdiff+)) and a second signal component 12n (for example, an inverting (negative) signal component (INdiff−)) and generates a differential output signal (OUTdiff) including a first signal component 14p (for example, a non-inverting (positive) signal component (OUTdiff+)) and a second signal component 14n (for example, an inverting (negative) signal component (OUTdiff−)). In an embodiment, the differential input signal (INdiff) is a relatively low voltage signal with a voltage range of 0.2V to 1.2V and the differential output signal (OUTdiff) is a relatively high voltage signal with a voltage range of about 2V to a programmable and selectable high voltage level of, for example, 5V, 10V, 15V and 20V. Thus, not only is the differential gain applied by the driver circuit 10, but also there is a common mode gain applied.

The driver circuit includes a first low voltage to high voltage (LV2HV) conversion circuit 16p having a signal input (Vin) coupled to receive the first signal component 12p of the differential input signal (INdiff) and a signal output (Vout) configured to provide the first signal component 14p of the differential output signal (OUTdiff). A control input (Sel<1:0>) is coupled to a data bus 20 to receive a data signal that specifies a programmable differential and common mode gain to be implemented by the LV2HV conversion circuit 16p in converting the first component of the differential input signal (INdiff) to generate the first component of the differential output signal (OUTdiff).

The driver circuit includes a second LV2HV conversion circuit 16n having a signal input (Vin) coupled to receive the second signal component 12n of the differential input signal (INdiff) and a signal output (Vout) configured to provide the second signal component 14n of the differential output signal (OUTdiff). A control input (Sel<1:0>) is coupled to the data bus 20 to receive the data signal that specifies the programmable differential and common mode gain to be implemented by the LV2HV conversion circuit 16n in converting the second component of the differential input signal (INdiff) to generate the second component of the differential output signal (OUTdiff).

The data signal on the data bus 20 is generated by a gain control circuit 22. In an embodiment, the data bus 20 is a two bit bus permitting the selection of four different gain levels. As an example, those four different gain levels may correspond to the programmable and selectable high voltage levels of 5V, 10V, 15V and 20V as noted above.

Figure 2:
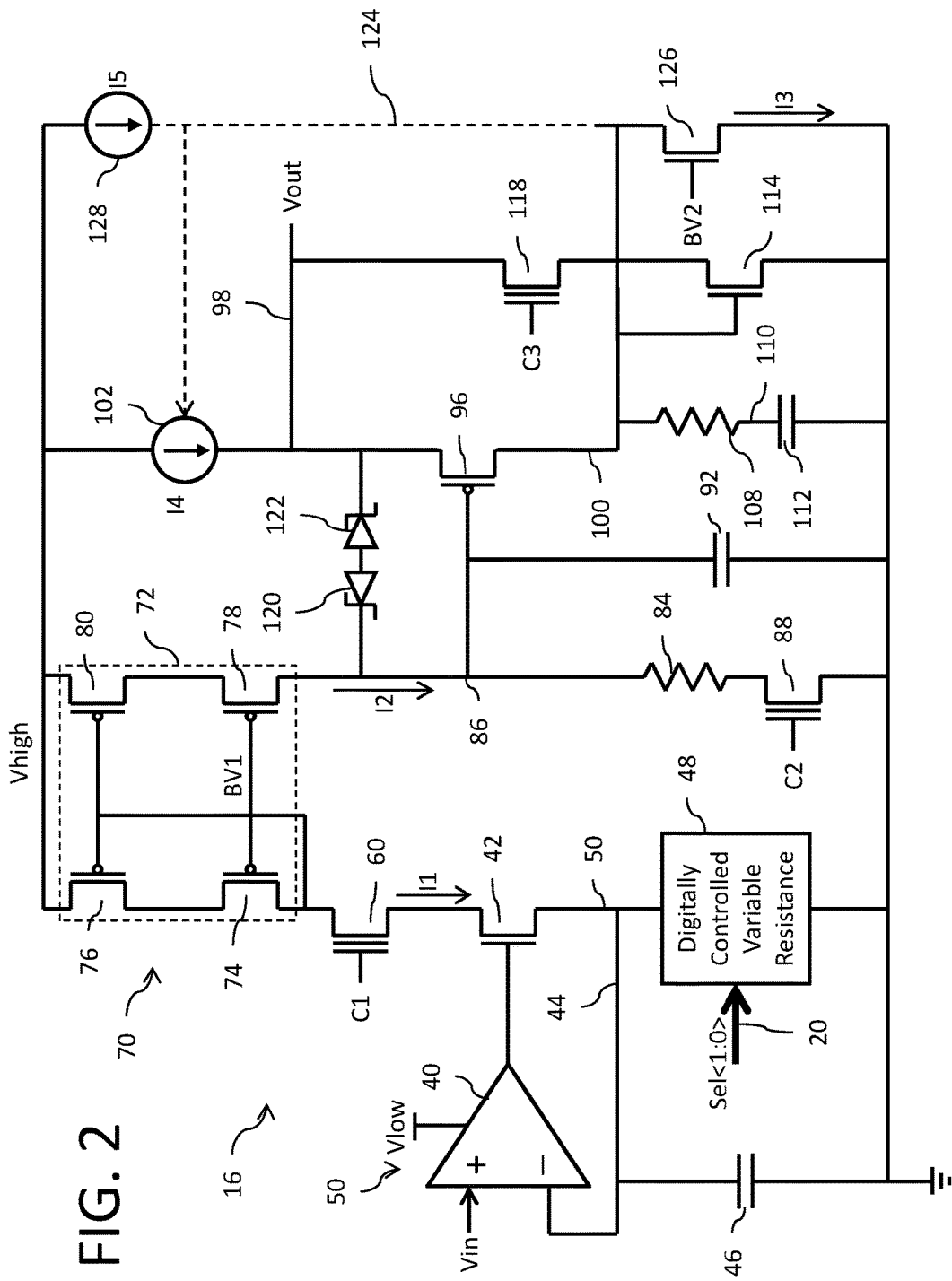
FIG. 2 is a schematic diagram of a low voltage to high voltage (LV2HV) conversion circuit within the driver circuit of FIG. 1.

Reference is now made to FIG. 2 showing a circuit diagram for the LV2HV conversion circuit 16. The input signal Vin is received at a first (for example, the non-inverting) input of an operational amplifier circuit 40. The operational amplifier circuit 40 is powered from a low voltage supply (Vlow) that corresponds to the power supply for the input signal Vin (for example, at a voltage of 1.2V). The output of the operational amplifier circuit 40 is coupled to the gate terminal of an n-channel transistor 42. The source terminal of transistor 42 is coupled in a feedback path 44 to the second (for example, inverting) input of the operational amplifier circuit 40. A capacitor 46 has a first terminal coupled to the source node of transistor 42 and a second terminal coupled to a ground reference node. The capacitor 46 functions to smooth the voltage at inverting input of the operational amplifier 40. A digitally controlled variable resistance circuit 48 is also coupled between the source node of transistor 42 at node 50 and the ground reference node. The digitally controlled variable resistance circuit 48 presents a resistor between the source node of transistor 42 and the ground reference node that has a variable resistance with a plurality of discrete resistance values selected by the data signal received on data bus 20. The operational amplifier circuit 40, transistor 42, feedback path 44 and variable resistance circuit 48 accordingly form a voltage to current converter circuit 50 that functions to convert the voltage of the input signal Vin to a corresponding current I1. The current I1 is a variable current that has a magnitude that is dependent on the voltage of the input signal Vin and the selected discrete resistance of the variable resistance circuit 48.

An n-channel transistor 60 has a source-drain path coupled in series with the source-drain path of transistor 42. The gate terminal of transistor 60 is coupled to receive a control signal C1. The transistor 60 is a high voltage switch transistor provided to protect low voltage transistor devices of the voltage to current converter circuit 50. The transistor 60 is turned on in response to assertion of the signal C1.

The LV2HV conversion circuit 16 further includes a current to high voltage converter circuit 70. The circuit 70 includes a cascode current mirroring circuit 72 having an input leg coupled to receive the current I1 and an output leg configured to generate a current I2=M*I1, wherein M is the current multiplication provided by the current mirroring circuit. The input leg of the cascode current mirroring circuit 72 is formed by a first (cascode) p-channel transistor 74 and second p-channel transistor 76 having source-drain paths coupled in series with each other. The source of transistor 76 is coupled to a high voltage supply (Vhigh) and the drain of transistor 74 is coupled to the drain of transistor 60. The voltage provided by the high voltage supply may, for example, be at 30V and can be obtained using a charge pump circuit. The output leg of the cascode current mirroring circuit 72 providing current I2 is formed by a third (cascode) p-channel transistor 78 and fourth p-channel transistor 80 having source-drain paths coupled in series with each other. The source of transistor 80 is coupled to the high voltage supply (Vhigh) and the drain of transistor 78 is coupled to node 86. The gate terminals of transistors 74 and 78 are connected to each other and receive a bias voltage BV1 generated by a bias voltage generator circuit (not shown). The gate terminals of transistors 76 and 80 are connected to each other and further connected to the drain terminal of transistor 74.

The current I2 is applied across a resistor 84 to develop a voltage at node 86. The resistor 84 has a first terminal coupled to node 86 and a second terminal coupled to the drain of n-channel transistor 88. The source of transistor 88 is coupled to the ground reference node, and the gate terminal of transistor 88 is coupled to receive a control signal C2. The transistor 88 is a pull-down high voltage transistor switch. The transistor 88 is actuated in response to assertion of the signal C2 to permit current I2 to pass to ground a produce the voltage at node 86.

A capacitor 92 has a first plate coupled to the node 86 and a second plate coupled to the ground reference node. The capacitor 92 functions to smooth the voltage at node 86.

A p-channel transistor 96 has a source coupled to an output node 98 and a gate terminal coupled to the node 86. The transistor 96 is configured to operate as a source-follower, and thus the voltage at the output node 98 will follow the voltage developed across resistor 84 at node 86 (where the voltage at node 86 is a gained-up version of the voltage Vin).

A current source 102 is supplied from the high supply voltage (Vhigh) to source a bias current to the source of transistor 96. In order to maintain the bias of the source-follower transistor 96, the current source 102 may further include a feedback loop 124 (as generally indicated by a dotted circuit path) with an input coupled to the drain of the transistor 96 and an output coupled to control operation of the current source 102. The feedback loop functions to ensure current balance such that the current I3 through a transistor 126 equals the sum of the current I4 provided by current source 102 and the current I5 provided by current source 128. The provision of the feedback loop is beneficial because it both provides bias to the output source-follower transistor 96 and also reduces power supply rejection. The transistor 126 has a drain terminal coupled to the drain of transistor 96 at node 100, a source terminal coupled to the ground reference node, and a gate terminal biased by a bias voltage BV2 generated by a bias voltage generator circuit (not shown).

The drain of transistor 96 is further coupled to a first terminal of a resistor 108 at node 100. A second terminal of resistor 108 is coupled to node 110. A capacitor 112 has a first terminal coupled to node 110 and a second terminal coupled to the ground reference node. The resistor 108 and capacitor 112 form an RC compensation circuit.

The drain of transistor 96 is further coupled to the gate terminal of an n-channel transistor 114. The source of transistor 114 is coupled to the ground reference node. An n-channel transistor 118 has its source-drain path coupled in series with the source-drain path of transistor 114. The drain of transistor 118 is further coupled to the output node 98. The gate terminal of transistor 118 is coupled to receive a control signal C3. The transistor 118 functions as a transistor switch forming a further feedback loop with respect to the output at node 98. This further feedback loop is a shunt regulation loop that is stabilized by the RC compensation provided by resistor 108 and capacitor 112 which protects against undesired movement of the voltage at the drain of transistor 96. Transistor 118 separates high voltage devices from low voltage devices. Transistor 118 is actuated in response to assertion of the control signal C3.

A pair of zener diodes 120 and 122 are coupled in series, with their anodes connected back to back between node 86 and node 98. These diodes provide gate to source voltage protection for the source-follower transistor 96.

Figure 3A:
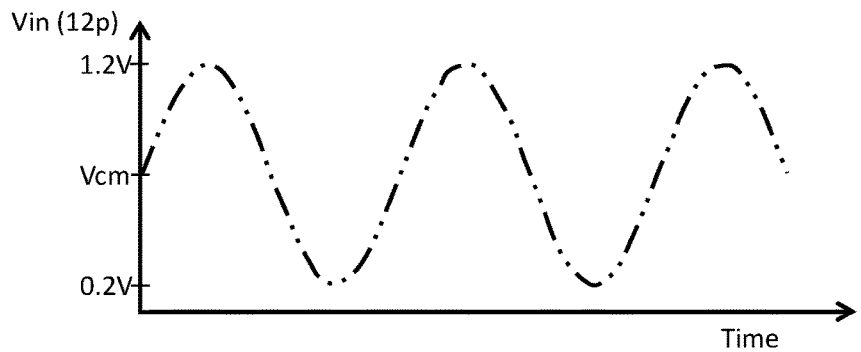
FIGS. 3A-3D illustrate operational waveforms for the circuits of FIGS. 1-2.
Figure 3B:
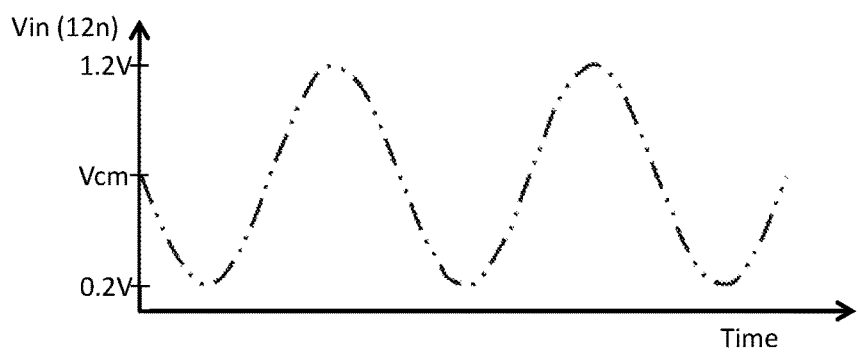
Figure 3C:
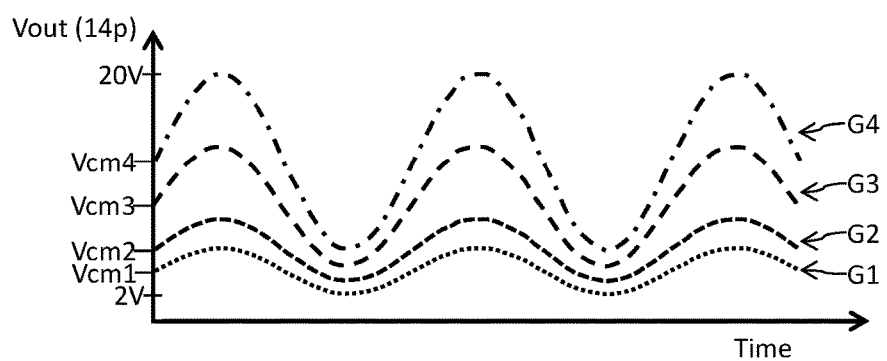
Figure 3D:
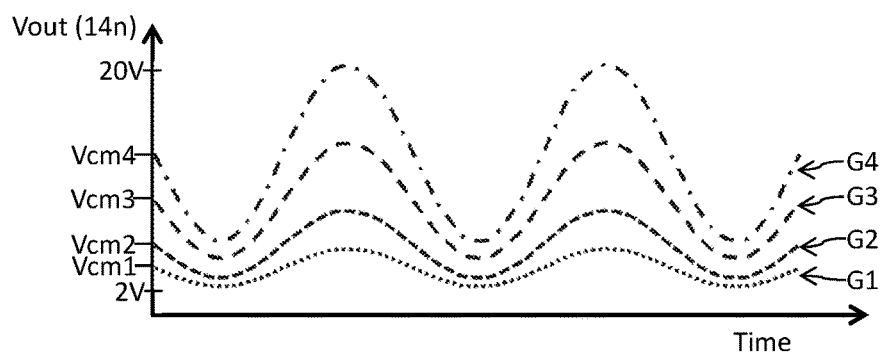

FIGS. 3A-3D illustrate operational waveforms for the circuit of FIGS. 1-2. FIGS. 3A-3B show the first (non-inverting (positive)) signal component 12p and second (inverting (negative)) signal component 12n, respectively, of the differential input signal (INdiff). The differential input signal (INdiff) here has a voltage range of 0.2V to 1.2V with a common mode voltage Vcm that is approximately equal to 0.7V. The illustration of differential input signal components with a sinusoidal waveform shape is by way of example only, it being understood that the differential input signal (INdiff) may have any desired analog signal waveform for driving a device coupled to receive the differential output signal (OUTdiff). Examples of such other analog signal waveforms include, but are not limited to, step, ramp triangular, sawtooth and exponential. The differential input signal (INdiff) may be generated by analog circuitry or may be generated from a digital source signal converted to analog by a digital-to-analog converter (not shown). FIGS. 3C-3D show the first (non-inverting (positive)) signal component 14p and second (inverting (negative)) signal component 14n, respectively, of the differential output signal (OUTdiff) with respect to four different gain settings (G1-G4) selected by the data signal applied to the control input (Sel<1:0>) via the data bus 20. The differential output signal (OUTdiff) may have a voltage range of 2V to 20V with corresponding common mode voltages Vcm1-Vcm4. More generally, the output voltage is given by the following equation:

$$Vout = \left(\frac{Vin}{Rv}\right)M * Rout$$

where: Rv is the resistance of the variable resistance circuit 48; M is the current multiplication provided by the current mirroring circuit 72; and Rout is the resistance of the resistor 84. The variation in Rv and Rout cancels out to the first degree. The output voltage is accordingly directly proportional to the input voltage Vin multiplied by the set gain G, where:

$$G = \left(\frac{Rout}{Rv}\right)M$$

In the circuit of FIG. 2, the transistors 60, 74, 78, 88, 96 and 118 and the transistor of current source 102 are high voltage transistor devices where the high voltage operational currents are on the order of a few microamperes. Because of this, there is a relatively small output current from the high voltage (charge pump) source Vhigh which directly translates to a relatively smaller occupied circuit area.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The invention claimed is:

1. A voltage driver circuit, comprising:
a first low voltage to high voltage (LV2HV) conversion circuit having a first input configured to receive a first input signal referenced to a first supply voltage and having a first output configured to generate a first output signal, wherein the first LV2HV conversion circuit comprises:
a first voltage to current conversion circuit configured to convert a voltage of the first input signal to a first current, wherein a magnitude of the first current is dependent on said voltage of the first input signal and a gain setting value;
a first current mirroring circuit configured to mirror the first current and output a second current; and
a first current to voltage conversion circuit configured to convert the second current to a voltage of said first output signal;
wherein said first current mirroring circuit and first current to voltage conversion circuit are referenced to a second supply voltage, said second supply voltage being greater than said first supply voltage.

2. The voltage driver circuit of claim 1, wherein said first voltage to current conversion circuit comprises an amplifier circuit powered from said first supply voltage.

3. The voltage driver circuit of claim 2, wherein said first voltage to current conversion circuit further comprises a transistor having a gate terminal coupled to an output of the amplifier circuit and a source-drain path configured to carry said first current.

4. The voltage driver circuit of claim 3, further comprising a feedback path coupling a source terminal of said transistor to an input of the amplifier circuit.

5. The voltage driver circuit of claim 3, where said first voltage to current conversion circuit further comprises a variable resistance circuit coupled in series with the source-drain path of said transistor, said variable resistance circuit having a resistance value set in response to said gain setting value.

6. The voltage driver circuit of claim 5, wherein said resistance value has a plurality of discrete and selectable resistance values.

7. The voltage driver circuit of claim 1, wherein said first current to voltage conversion circuit comprises:
a source-follower transistor having a gate terminal and a source terminal;
a resistor across which a voltage is developed in response to the second current; and
a capacitor coupled in parallel with the resistor;
wherein said gate terminal of the source-follower transistor is coupled to said resistor and capacitor.

8. The voltage driver circuit of claim 7, wherein said first current to voltage conversion circuit further comprises a transistor having a source-drain path coupled to the source node of the source-follower transistor and a gate terminal coupled to a drain terminal of the source-follower transistor.

9. The voltage driver circuit of claim 7, wherein said first current to voltage conversion circuit further comprises a current source configured to generate a bias current applied to the source terminal of said source-follower transistor.

10. The voltage driver circuit of claim 9, wherein said first current to voltage conversion circuit further comprises a feedback circuit having an input coupled to a drain terminal of the source-follower transistor and an output coupled to said current source.

11. The voltage driver circuit of claim 7, further comprising a pair of zener diodes having anodes connected back to back and cathodes connected, respectively, to an output of the current mirroring circuit and the source terminal of the source-follower transistor.

12. The voltage driver circuit of claim 1, wherein said first current mirroring circuit includes cascode transistors.

13. The voltage driver circuit of claim 1, wherein the gain setting value is provided by a digital signal.

14. The voltage driver circuit of claim 1, further comprising:
a second LV2HV conversion circuit having a second input configured to receive a second input signal referenced to the first supply voltage and having a second output configured to generate a second output signal, wherein the second LV2HV conversion circuit comprises:
a second voltage to current conversion circuit configured to convert a voltage of the second input signal to a third current, wherein a magnitude of the third current is dependent on said voltage of the second input signal and the gain setting value;
a second current mirroring circuit configured to mirror the third current and output a fourth current; and
a second current to voltage conversion circuit configured to convert the fourth current to a voltage of said second output signal;
wherein said second current mirroring circuit and second current to voltage conversion circuit are referenced to the second supply voltage.

15. The voltage driver circuit of claim 14, wherein said first and second input signals are positive and negative components of a differential input signal.

16. A low voltage to high voltage conversion circuit, comprising:
a voltage to current conversion circuit having an input that receives an input signal referenced to a first supply voltage and having a first common mode voltage and a first voltage range, said voltage to current conversion circuit configured to convert a voltage of the input signal to a first current;

a current to voltage conversion circuit configured to convert the first current to a voltage of an output signal referenced to a second supply voltage, said second supply voltage being greater than said first supply voltage, and having a second common mode voltage and a second voltage range, said second common mode voltage being greater than said first common mode voltage and said second voltage range being greater than said first voltage range;

wherein a magnitude of the first current is dependent on said voltage of the input signal and a gain setting value which controls both a voltage range gain from the first voltage range to the second voltage range and a common mode gain from the first common mode voltage to the second common mode voltage.

17. The low voltage to high voltage conversion circuit of claim 16, wherein the current to voltage conversion circuit comprises:
a current mirroring circuit configured to mirror the first current and output a second current;
a conversion circuit configured to convert the second current to a gate voltage; and
a source follower circuit configured to receive the gate voltage and generate the output voltage.

18. The low voltage to high voltage conversion circuit of claim 16, wherein said first voltage to current conversion circuit comprises:
an amplifier circuit powered from said first supply voltage;
a transistor having a gate terminal coupled to an output of the amplifier circuit and a source-drain path configured to carry said first current; and
a feedback path coupling a source terminal of said transistor to an input of the amplifier circuit.

19. The low voltage to high voltage conversion circuit of claim 16, where said first voltage to current conversion circuit comprises a variable resistance circuit coupled in series with the first current, said variable resistance circuit having a resistance value set in response to gain setting value.

20. The low voltage to high voltage conversion circuit of claim 19, wherein said resistance value has a plurality of discrete and selectable resistance values.

21. The low voltage to high voltage conversion circuit of claim 16, wherein said current to voltage conversion circuit comprises:
a source-follower transistor having a gate terminal and a source terminal;
a resistor across which a voltage is developed in response to the first current; and
a capacitor coupled in parallel with the resistor;
wherein said gate terminal of the source-follower transistor is coupled to said resistor and capacitor.

22. The low voltage to high voltage conversion circuit of claim 21, wherein said current to voltage conversion circuit further comprises a transistor having a source-drain path coupled to the source node of the source-follower transistor and a gate terminal coupled to a drain terminal of the source-follower transistor.

23. The low voltage to high voltage conversion circuit of claim 21, wherein said current to voltage conversion circuit further comprises a current source configured to generate a bias current applied to the source terminal of said source-follower transistor.

24. The low voltage to high voltage conversion circuit of claim 23, wherein said current to voltage conversion circuit further comprises a feedback circuit having an input coupled to a drain terminal of the source-follower transistor and an output coupled to said current source.

25. The low voltage to high voltage conversion circuit of claim 16, wherein the gain setting value is provided by a digital signal.

26. A voltage driver circuit, comprising:
a first low voltage to high voltage (LV2HV) conversion circuit having a first input configured to receive a first input signal and having a first output configured to generate a first output signal, wherein the first LV2HV conversion circuit comprises:
a first voltage to current conversion circuit configured to convert a voltage of the first input signal to a first current, wherein a magnitude of the first current is dependent on said voltage of the first input signal and a gain setting value;
a first current mirroring circuit configured to mirror the first current and output a second current; and
a first current to voltage conversion circuit configured to convert the second current to a voltage of said first output signal; and
a second LV2HV conversion circuit having a second input configured to receive a second input signal and having a second output configured to generate a second output signal, wherein the second LV2HV conversion circuit comprises:
a second voltage to current conversion circuit configured to convert a voltage of the second input signal to a third current, wherein a magnitude of the third current is dependent on said voltage of the second input signal and the gain setting value;
a second current mirroring circuit configured to mirror the third current and output a fourth current; and
a second current to voltage conversion circuit configured to convert the fourth current to a voltage of said second output signal.

27. The voltage driver circuit of claim 26, wherein the first and second input signals are referenced to a first supply voltage and wherein said first and second current mirroring circuits and said first and second current to voltage conversion circuits are referenced to a second supply voltage, said second supply voltage being greater than said first supply voltage.

28. The voltage driver circuit of claim 27, wherein each of said first and second voltage to current conversion circuits comprises:
an amplifier circuit powered from said first supply voltage;
a transistor having a gate terminal coupled to an output of the amplifier circuit and a source-drain path configured to carry said first or third current; and
a feedback path coupling a source terminal of said transistor to an input of the amplifier circuit.

29. The voltage driver circuit of claim 28, wherein each of said first and second voltage to current conversion circuits comprises a variable resistance circuit coupled in series with the source-drain path of said transistor, said variable resistance circuit having a resistance value set in response to the gain setting value.

30. The voltage driver circuit of claim 29, wherein said resistance value has a plurality of discrete and selectable resistance values.

31. The voltage driver circuit of claim 27, wherein each of said first and second current to voltage conversion circuits comprises:
- a source-follower transistor having a gate terminal and a source terminal;
- a resistor across which a voltage is developed in response to the second or fourth current; and
- a capacitor coupled in parallel with the resistor;
- wherein said gate terminal of the source-follower transistor is coupled to said resistor and capacitor.

32. The voltage driver circuit of claim 31, wherein each of said first and second current to voltage conversion circuits further comprises a transistor having a source-drain path coupled to the source node of the source-follower transistor and a gate terminal coupled to a drain terminal of the source-follower transistor.

33. The voltage driver circuit of claim 31, wherein each of said first and second current to voltage conversion circuits further comprises a current source configured to generate a bias current applied to the source terminal of said source-follower transistor.

34. The voltage driver circuit of claim 33, wherein each of said first and second current to voltage conversion circuits further comprises a feedback circuit having an input coupled to a drain terminal of the source-follower transistor and an output coupled to said current source.

35. The voltage driver circuit of claim 33, wherein each of said first and second current to voltage conversion circuits further comprises a pair of zener diodes having anodes connected back to back and cathodes connected, respectively, to an output of the current mirroring circuit and the source terminal of the source-follower transistor.

36. The voltage driver circuit of claim 26, wherein the gain setting value is provided by a digital signal.

37. The voltage driver circuit of claim 26, wherein said first and second input signals are positive and negative components of a differential input signal.

* * * * *